(12) United States Patent
Lee et al.

(10) Patent No.: US 9,253,886 B2
(45) Date of Patent: Feb. 2, 2016

(54) MODULE AND PRODUCTION METHOD

(75) Inventors: Kim Choong Lee, Singapore (SG); Marc Huesgen, Singapore (SG)

(73) Assignee: EPCOS AG, Munich (DE)

( * ) Notice: Subject to any disclaimer, the term of this patent is extended or adjusted under 35 U.S.C. 154(b) by 287 days.

(21) Appl. No.: 13/812,490

(22) PCT Filed: Jun. 15, 2011

(86) PCT No.: PCT/EP2011/059961
§ 371 (c)(1),
(2), (4) Date: Mar. 21, 2013

(87) PCT Pub. No.: WO2012/013416
PCT Pub. Date: Feb. 2, 2012

(65) Prior Publication Data
US 2013/0176686 A1    Jul. 11, 2013

(30) Foreign Application Priority Data

Jul. 28, 2010  (DE) .......................... 10 2010 032 506

(51) Int. Cl.
*H05K 1/18* (2006.01)
*H05K 3/32* (2006.01)
(Continued)

(52) U.S. Cl.
CPC ................ *H05K 1/181* (2013.01); *B81B 7/007* (2013.01); *B81B 7/0058* (2013.01); *H01L 21/56* (2013.01);
(Continued)

(58) Field of Classification Search
CPC ..... H01L 24/17; H01L 24/11; H01L 2924/14; H01L 2933/0033; H01L 23/3114; H01L 23/49575; H01L 23/49822; H01L 2225/06517; H01L 23/5389; H01L 24/03; H01L 2225/06513; H01L 2225/06524; H05K 1/115; H05K 1/0298; H05K 1/181; H05K 1/036; H05K 1/11; H05K 2201/10674
USPC ............ 361/764, 783, 767; 257/737, 777, 99, 257/676, 778; 438/107, 613, 26, 108, 121, 438/126, 127, 15, 106, 25, 51
See application file for complete search history.

(56) References Cited

U.S. PATENT DOCUMENTS

| 5,448,114 A | 9/1995 | Kondoh et al. |
| 6,982,380 B2 * | 1/2006 | Hoffmann ............... H01L 24/31 174/520 |

(Continued)

FOREIGN PATENT DOCUMENTS

| DE | 4323799 A1 | 1/1994 |
| DE | 102006025162 B3 | 1/2008 |

(Continued)

*Primary Examiner* — Hung S Bui
*Assistant Examiner* — Michael Matey
(74) *Attorney, Agent, or Firm* — McDermott Will & Emery LLP

(57) ABSTRACT

The invention specifies a module comprising a carrier substrate (6) having an electrical wiring and a component chip mounted on the carrier substrate (6) using flip-chip technology, wherein the component chip (1) has, on its surface (2) facing the carrier substrate (6), component structures (3), a supporting frame (4) and supporting elements (5), the supporting elements (5) produce an electrical connection between the component structures (3) and the electrical wiring of the carrier substrate (6), and the height of the supporting elements and the height of the supporting frame (4) correspond. Furthermore, the invention specifies a method for producing the module.

6 Claims, 3 Drawing Sheets

(51) Int. Cl.
  *B81B 7/00* (2006.01)
  *H01L 21/56* (2006.01)
  *H01L 23/31* (2006.01)
  *H03H 9/05* (2006.01)
  *H03H 9/10* (2006.01)
  *H01L 23/498* (2006.01)
  *H01L 23/00* (2006.01)

(52) U.S. Cl.
  CPC ............ H01L 21/563 (2013.01); H01L 21/565 (2013.01); H01L 23/3121 (2013.01); H01L 24/29 (2013.01); H01L 24/32 (2013.01); H01L 24/73 (2013.01); H01L 24/81 (2013.01); H03H 9/059 (2013.01); H03H 9/1057 (2013.01); H03H 9/1064 (2013.01); H03H 9/1071 (2013.01); H03H 9/1078 (2013.01); H03H 9/1085 (2013.01); H03H 9/1092 (2013.01); H05K 3/32 (2013.01); *B81B 2207/096* (2013.01); *H01L 23/49833* (2013.01); *H01L 24/13* (2013.01); *H01L 2224/10135* (2013.01); *H01L 2224/13014* (2013.01); *H01L 2224/13082* (2013.01); *H01L 2224/13147* (2013.01); *H01L 2224/291* (2013.01); *H01L 2224/29011* (2013.01); *H01L 2224/29014* (2013.01); *H01L 2224/2919* (2013.01); *H01L 2224/29082* (2013.01); *H01L 2224/29147* (2013.01); *H01L 2224/32225* (2013.01); *H01L 2224/73103* (2013.01); *H01L 2224/73203* (2013.01); *H01L 2224/81139* (2013.01); *H01L 2224/81191* (2013.01); *H01L 2224/81801* (2013.01); *H01L 2224/83801* (2013.01); *H01L 2924/01005* (2013.01); *H01L 2924/01029* (2013.01); *H01L 2924/01058* (2013.01); *H01L 2924/01082* (2013.01); *H01L 2924/0665* (2013.01); *H01L 2924/09701* (2013.01); *H01L 2924/1461* (2013.01); *Y10T 29/4913* (2015.01); *Y10T 29/49146* (2015.01)

(56) References Cited

U.S. PATENT DOCUMENTS

| | | | |
|---|---|---|---|
| 7,673,386 | B2 | 3/2010 | Stelzl et al. |
| 8,110,962 | B2* | 2/2012 | Bauer ................ H03H 9/02866 257/416 |
| 8,558,356 | B2* | 10/2013 | Kiwitt ...................... H01G 4/40 257/664 |
| 2004/0100164 | A1* | 5/2004 | Murata et al. ................. 310/348 |
| 2005/0034888 | A1 | 2/2005 | Hoffmann et al. |
| 2007/0222056 | A1* | 9/2007 | Bauer et al. ..................... 257/687 |
| 2009/0071710 | A1* | 3/2009 | Stelzl et al. ..................... 174/520 |
| 2009/0224851 | A1* | 9/2009 | Feiertag ................ H03H 9/059 333/186 |
| 2010/0127377 | A1* | 5/2010 | Bauer et al. ..................... 257/690 |
| 2010/0148285 | A1 | 6/2010 | Bauer et al. |
| 2012/0111617 | A1* | 5/2012 | Motomura et al. ........... 174/257 |

FOREIGN PATENT DOCUMENTS

| | | |
|---|---|---|
| DE | 102007025992 A1 | 12/2008 |
| DE | 102007028288 A1 | 12/2008 |
| JP | 07212181 A | 8/1995 |
| JP | 2004-194290 A | 7/2004 |
| JP | 2009-539235 A | 11/2009 |
| WO | 03/058810 A1 | 7/2003 |
| WO | 2005/102910 A1 | 11/2005 |

* cited by examiner

MODULE AND PRODUCTION METHOD

The invention relates to a module wherein a component chip is applied on a carrier substrate using a flip-chip method.

The component chip is in particular, an SAW filter chip having sensitive component structures on its surface. Said component structures are mechanically sensitive and can be protected by a cavity, for example. A housing of the component chip could be used for this purpose, for example.

For such components, DE 10 2006 025 162 B3, for example, discloses a component encapsulation wherein a component chip carrying the component structures is mounted on a carrier substrate using flip-chip technology with the aid of bump connections and is arranged at a distance from the carrier substrate above the latter. In this case, a frame is formed on the surface of the carrier substrate, which frame bears on the surface of the component chip or leaves a narrow gap and thus forms a cavity that accommodates the component structures. The cavity is sealed off toward the outside by a sealing material. In addition, supporting elements are provided which mechanically support the component chip and also produce electrical connections between component chip and carrier substrate.

Furthermore, DE 10 2007 025 992 A1 discloses an MEMS package wherein a supporting frame is applied on a substrate. In an alternative exemplary embodiment, this frame structure is applied on the chip itself. The electrical connections between component chip and carrier substrate are effected via bumps.

It is an object of the present invention to specify a module which is simple to produce and wherein components arranged on a chip need not be protected by a separate housing.

This object is achieved according to the invention by means of a module comprising the features of claim 1. Claim 8 relates to a production method for a module according to the invention. The further claims relate to advantageous configurations of the invention.

A module is proposed which comprises a component chip applied on a single- or multilayered carrier substrate using flip-chip technology. On its surface facing the carrier substrate, said component chip has component structures, a supporting frame and supporting elements. Furthermore, an electrical connection between the component structures of the component chip and the carrier substrate is produced by the supporting elements and/or the supporting frame. The supporting elements and the supporting frame are produced on the surface of the component chip in a common method step, such that during production the heights of the supporting elements and of the supporting frame can easily be established such that they correspond.

In the case of the module according to the invention it is possible, in a single or a plurality of method steps, to apply one or more component chips on the carrier substrate using flip-chip technology, to electrically connect them to the carrier substrate and to form a closed-off cavity between chip and surface of the carrier substrate. Even further components can be arranged on the carrier substrate alongside the component chip applied using flip-chip technology.

The electrical connection between the component chip and the carrier substrate is effected by supporting elements applied on the surface of the chip.

In one configuration of the invention, the supporting frame is also mechanically fixedly connected and e.g. soldered to the carrier substrate. The soldering of the supporting frame to the carrier substrate principally serves for mechanically fixing the supporting frame. In this case, however, it is generally also possible for the frame to be connected to ground.

If the component chip is connected to the carrier substrate then the supporting frame forms a cavity in which the component structures are protected against external influences. Within the meaning of this application, a component structure is understood to be, in particular, a microelectromechanical component (MEMS component) and/or electroacoustic component structures operating with acoustic waves, for example a resonator operating with bulk acoustic waves or a transducer operating with surface acoustic waves—as a SAW transducer. Microelectromechanical components can comprise sensors and actuators, which generally are mechanically sensitive or have to remain mobile for their function in the encapsulated state.

In order to protect the components even better, the component chip and the module carrier are covered with an encapsulation layer over a large area. Said encapsulation layer is a glob top compound, for example. The latter can comprise a resin that is processable in liquid form and is thermally curable, e.g. an epoxy-based resin.

Preferably, the supporting elements and the supporting frame substantially consist of metal, in particular of copper. Soldering material can be additionally applied at their ends facing the carrier substrate.

The present invention furthermore relates to a method for producing a module described above. According to the invention, in this case a supporting frame and supporting elements are produced on that surface of the component chip which faces the carrier substrate, in a common method step, such that their heights correspond. Since supporting frame and supporting elements are coordinated with one another in terms of their heights, a hermetically sealed cavity can be formed during connection to the planar surface of the carrier substrate. The component chip is mounted onto the carrier substrate using the flip-chip method, wherein an electrical connection between the component structures and the electrical wiring of the carrier substrate is produced via the supporting elements.

The carrier substrate has an integrated electrical wiring. For this purpose, it can be embodied in multilayer fashion, wherein patterned metallization planes that realize a corresponding wiring are provided on, between and below individual layers of a mechanically stable and electrically insulating material. The individual metallization planes are connected to one another via plated-through holes that are preferably offset relative to one another, thereby producing an electrical contact for metallic connection areas applied on the surface of the carrier substrate and external contacts arranged on the underside of the carrier substrate.

In the metallization planes, the metallization can additionally be patterned to form passive electrical components such as resistances, inductances and capacitances, which together realize a circuit or a part of a circuit. The circuit is preferably connected to the component chip and interacts with the latter.

Suitable mechanically stable material includes an, in particular highly filled, plastics material having low water absorption, low gas permeability and an adaptable coefficient of thermal expansion (e.g. LCP (liquid crystal polymer)) or a ceramic, such as, in particular, an HTCC (high temperature cofired ceramic) or an LTCC (low temperature cofired ceramic).

The connection metallizations on the top side of the carrier substrate have a solderable or bondable surface, in particular a UBM metallization (under bump metallization). Regions of this metallization layer are patterned to form connection or contact areas.

In one configuration of the method, a metallic growth layer or seed layer for a later metallization is applied on the surface of the carrier substrate, for example in an electroless fashion or in a PVD method. Above said growth layer, an electrolytically stable resist is applied and patterned in accordance with the desired structure of the supporting frame and of the supporting elements, e.g. by means of laser lithography. With a carrier substrate that is not warped, it is also possible to effect photolithographic exposure via a mask.

In the next step, the growth layer is electrolytically reinforced, for example by the electrodeposition of copper. A passivation layer, for example composed of nickel, can additionally be applied to the copper as a covering layer.

Subsequently, a planarization method can be carried out in which the surfaces of the electroplating resist and of the reinforced growth layer are removed until a surface that is planar overall is produced. Subsequently, the electroplating resist is removed and the underlying residues of the growth layer are etched away.

The planarization gives rise, on the component chip, to a supporting frame and supporting elements having a planar surface, such that they can terminate flush or almost flush with the likewise planar surface of the carrier substrate.

Subsequently, the supporting elements are electrically connected to the carrier substrate. In one embodiment of the present invention, in the same step the supporting frame is also soldered to the carrier substrate. The component chip and the carrier substrate can be electrically connected to one another via the supporting elements, wherein at the same time a mechanical stability is obtained and a cavity is furthermore enclosed between supporting frame, component chip and carrier substrate. In said cavity, the component structures are protected and have enough free space for functionally governed deflections or oscillations.

It is possible to apply further components on the carrier substrate alongside the component chip described here. In order to improve the mechanical protection, an encapsulation layer can then also be applied jointly over the component chip and the further components. This can be a glob top covering, for example.

The invention is explained in greater detail below on the basis of exemplary embodiments and the associated figures. The figures show various exemplary embodiments of the invention on the basis of schematic illustrations that are not true to scale.

Figure 1:
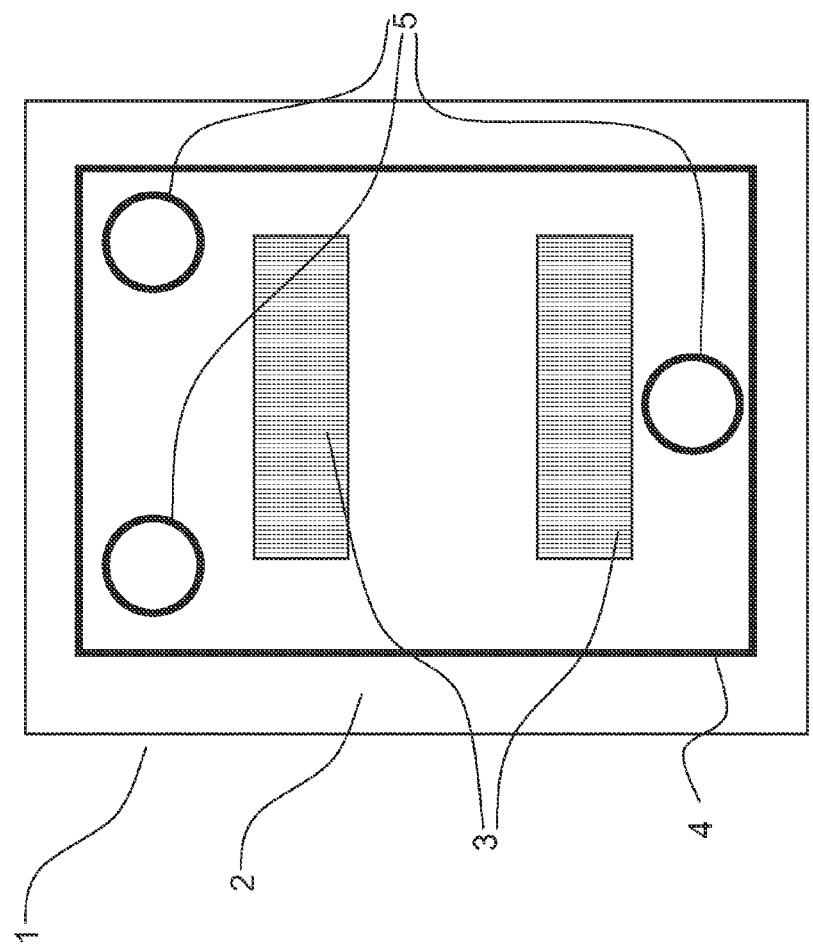
FIG. 1 shows a component chip with supporting elements and a supporting frame.

FIG. 1 shows a component chip 1 as a bare chip, a so-called bare die. The component chip 1 illustrated in FIG. 1 is here an SAW filter having component structures 3 on its top side 2. The top side 2 of the component chip 1 furthermore has a supporting frame 4 and supporting elements 5. The supporting elements can be seated on connection areas of the component structures or electrically connected thereto.

Supporting frame 4 and supporting elements 5 are coordinated with one another in terms of their height since they are produced in a common method step and were additionally planarized, if appropriate. Supporting frame 4 and supporting elements 5 project beyond the component structures 3 in terms of height. The component structures 3 are arranged within the frame 4.

Figure 2:
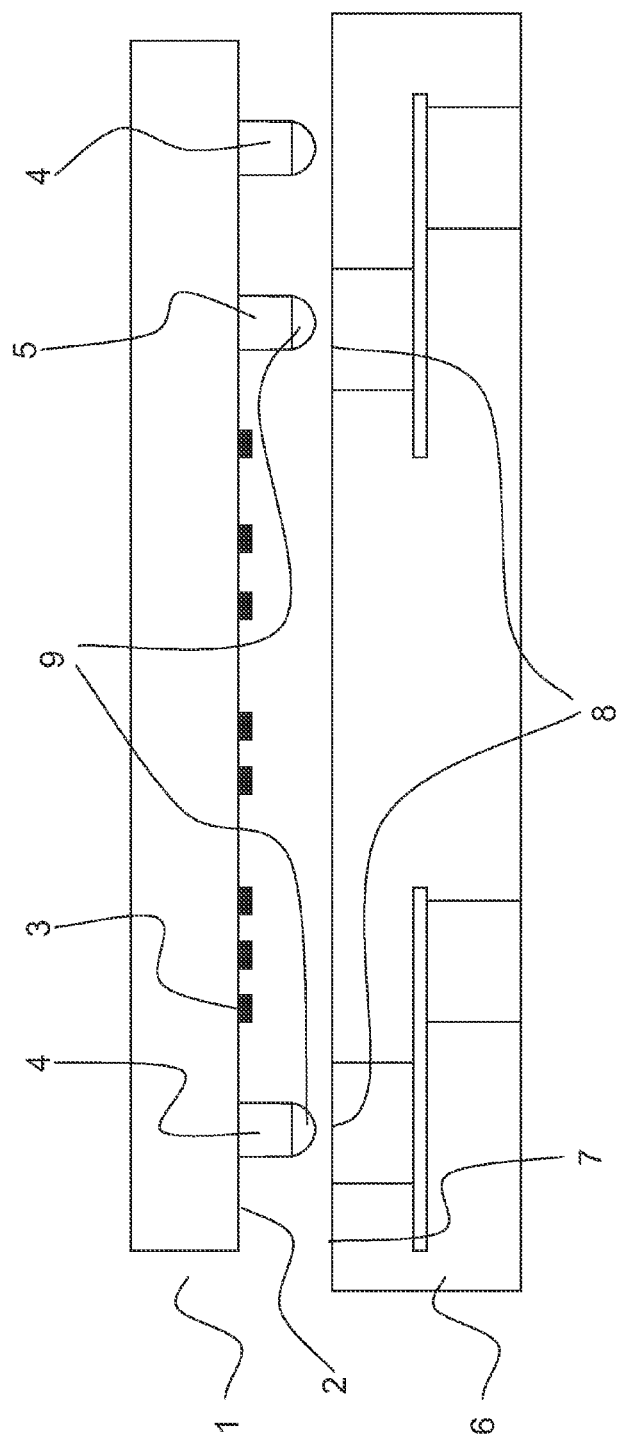
FIG. 2 shows the module according to the invention in an unconnected state.

FIG. 2 shows the module according to the invention in cross section in a method step prior to the component chip being bonded on or soldered on. The component chip 1 is bonded or soldered on a carrier substrate 6. The carrier substrate 6 can be embodied in single- or multilayered fashion. Connection or contact areas 8 are patterned on the surface 7 of the carrier substrate 6.

The supporting elements 5 and the supporting frame 4 on the component chip 1 are arranged in such a way that they can be connected to the connection or contact areas 8 of the carrier substrate 6.

The supporting elements 5 and the supporting frame 4 substantially consist of metal, in particular of copper. In this embodiment, soldering material 9 is situated at their ends facing the carrier substrate 6.

Figure 3:
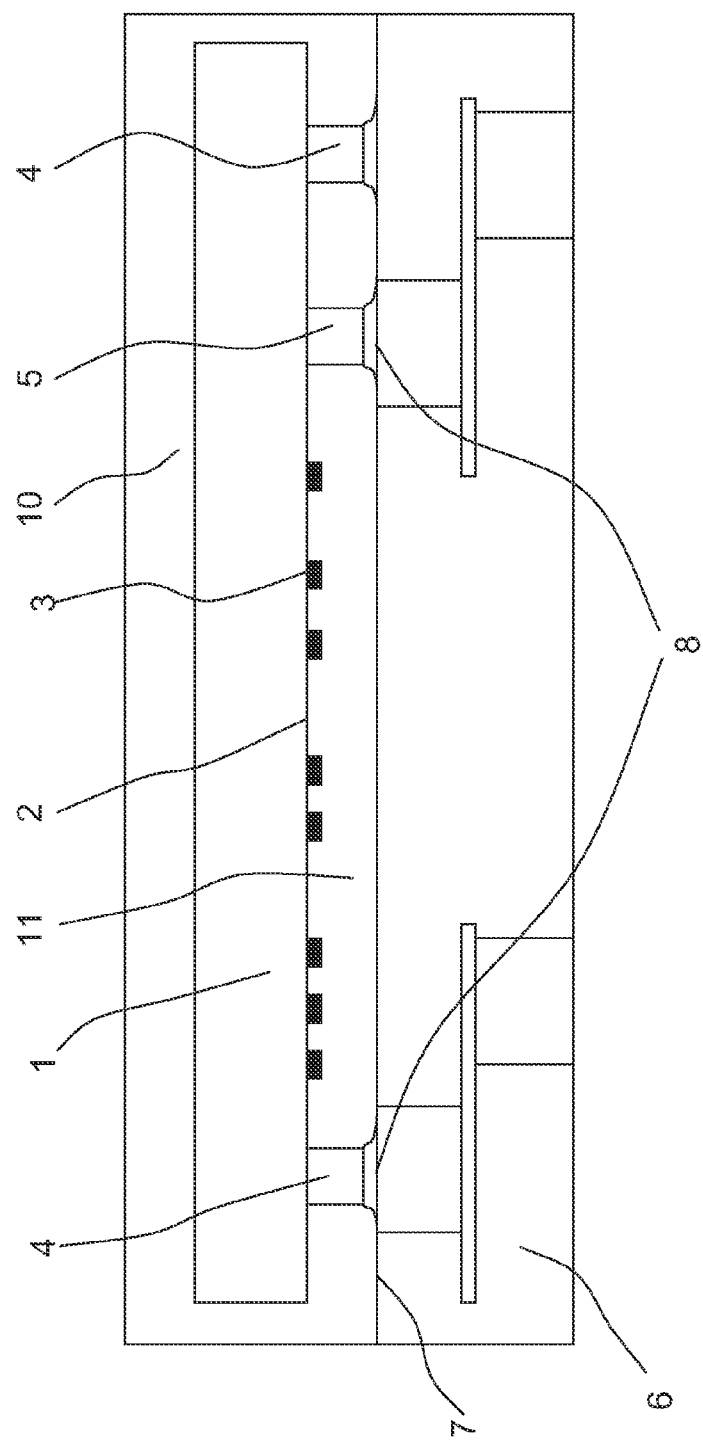
FIG. 3 shows the module according to the invention wherein the component chip has been connected to the carrier substrate and an encapsulation layer has been applied.

FIG. 3 shows the module in a later method step, wherein the component chip 1 has been soldered to the carrier substrate 6 and wherein, furthermore, an encapsulation layer 10 has been applied above the component chip. As a result of the soldering of the supporting elements 5 and of the supporting frame 4 to the carrier substrate 6, an electrical connection is produced between the component structures 3 of the component chip 1 and the carrier substrate 6. In the same step, furthermore, a cavity 11 is formed between supporting frame 4, component chip 1 and carrier substrate 6. In said cavity 11, the component structures 3 are protected against external influences. It is thus possible for a module to ensure the mechanical protection of the component structures 3 and the electrical connection to the component structures 3 in a common method step.

In the case of the module according to the invention, one or more bare dies can be applied on the carrier substrate 6 using flip-chip methods. Unnecessary housings for the bare component chips 1 can be obviated in this way. Accordingly, it is possible to arrange the components with a higher packing density on the module carrier. Furthermore, the height of the module can be reduced. Moreover, however, it is nevertheless possible to apply discrete components on the carrier substrate using the SMD method.

As mechanical protection, an encapsulation layer 10 is additionally applied to the module. This can be a polymer compound, a film or a resin, for example a glob top layer.

LIST OF REFERENCE SIGNS

1 Component chip
2 Top side of the component chip 1
3 Component structures
4 Supporting frame
5 Supporting elements
6 Carrier substrate
7 Surface of the carrier substrate 6
8 Connection or contact area
9 Soldering material
10 Encapsulation layer
11 Cavity

The invention claimed is:

1. A method for producing a module, the method comprising:
providing a carrier substrate having an electrical wiring;
providing at least one component chip having component structures on its surface facing the carrier substrate;
producing a supporting frame and supporting elements, which correspond in terms of their heights, on the surface of the component chip facing the carrier substrate in a common method step; and
mounting the component chip onto the carrier substrate using the flip-chip method, wherein an electrical connection between the component structures and the electrical wiring of the carrier substrate is produced via the supporting elements, and wherein the step of producing the supporting frame and the supporting elements comprises the sub-steps of:
applying a metallic growth layer on the component chip;
producing a molding mask, corresponding to an electroplating resist, that omits the supporting frame and the supporting elements lithographically on the component chip for the purpose of producing the supporting frame and the supporting elements;
electrolytically reinforcing the metallic growth layer; and
removing the molding mask.

2. The method according to claim 1, further comprising:
applying a metallization layer to the carrier substrate, wherein regions of the metallization layer are patterned to form connection or contact areas.

3. The method according to claim 1, further comprising:
soldering the supporting frame to the carrier substrate, wherein a cavity is enclosed between supporting frame, component chip and carrier substrate.

4. The method according to claim 1, further comprising:
applying an encapsulation layer to the component chip and the carrier substrate over a large area.

5. The method according to claim 1, further comprising:
applying further electrical components on the carrier substrate; and
applying an encapsulation layer to the component chip, the further electrical components and the carrier substrate over a large area.

6. The method according to claim 1, wherein the component chip is an SAW filter chip.

* * * * *